United States Patent [19]
Hung et al.

[11] Patent Number: 5,917,699
[45] Date of Patent: Jun. 29, 1999

[54] HEAT-RADIATING DEVICE

[75] Inventors: Sung Chen Hung; Ching Ming Chen, both of Taipei, Taiwan

[73] Assignee: Compal Electronics Inc., Taipei, Taiwan

[21] Appl. No.: 08/987,919

[22] Filed: Dec. 9, 1997

[51] Int. Cl.[6] .................................................... H05K 7/20
[52] U.S. Cl. .................. 361/697; 165/104.33; 174/15.2; 364/700
[58] Field of Search ................................. 165/80.2, 80.3, 165/185, 104.26, 104.33; 174/15.2, 16.3; 257/715, 722; 361/687, 694–697, 699, 700, 704, 707

[56] References Cited

U.S. PATENT DOCUMENTS 5,513,070  4/1996  Xie et al. ................................. 361/700
5,568,360  10/1996  Penniman et al. ....................... 361/700
5,598,320  1/1997  Toedtman et al. ....................... 361/700

Primary Examiner—Gregory Thompson
Attorney, Agent, or Firm—Bacon & Thomas, PLLC

[57] ABSTRACT

A heat-radiating device including a heat-radiator and a heat conductive rod for contacting with a heat source. The heat-radiator is composed of a heat conductive pipe body integrally formed by extrusion, a heat conductive column co-axially extending in the heat conductive pipe body and multiple heat-radiating vanes radially arranged between an outer periphery of the heat conductive column and an inner periphery of the heat conductive pipe body. The heat conductive rod is connected with the heat conductive column, whereby the column absorbs the heat conducted by the heat conductive rod from the heat source and the heat is spread from the center of the heat conductive column. The distance is shortest so that the heat can be quickly and evenly conducted to the respective vanes and the heat conductive pipe body and then quickly dissipated due to natural convection of air or forced convection by a fan.

15 Claims, 6 Drawing Sheets

5,917,699

HEAT-RADIATING DEVICE

BACKGROUND OF THE INVENTION

The present invention relates to a heat-radiating device in which a heat conductive rod quickly and evenly conducts the heat from a heat source to a heat-radiator. Multiple vanes are radially arranged in the heat-radiator to define multiple passages, whereby the heat is quickly and effectively dissipated due to natural convection of air or forced convection by a fan.

FIG. 1 shows a conventional heat-radiating device including a heat-radiator 10 composed of a base seat 100 formed with a groove 106, a U-shaped shade 102 and multiple heat-radiating fins 104. The heat-radiating fins 104 by conductive adhesive (not shown) are perpendicularly adhered to the upper surface of the base seat 100 and the lower surface of top section of the U-shaped shade 102. A heat conductive rod 12 is parallelly adhered in the groove 106 of the lower surface of the base seat 100 by heat conductive adhesive (not shown). A fan 14 is secured to the heat-radiator 10. In use, the rod section of the heat conductive rod 12 contacts with a heat source so as to conduct the heat from the heat source to the base seat 100. As shown in FIGS. 2 and 2A the heat absorbed by the base seat 100 is gradually successively conducted to the entire fins 104. Therefore, the heat-radiating rate is relatively low.

SUMMARY OF THE INVENTION

It is a primary object of the present invention to provide a heat-radiating device in which a heat conductive rod quickly and evenly conducts the heat from a heat source to the entire heat-radiator. The heat is then quickly and effectively dissipated due to natural convection of air or forced convection by a fan.

According to the above object, the heat-radiating device of the present invention includes a heat-radiator and a heat conductive rod for contacting with a heat source. The heat-radiator includes a heat conductive pipe body having a first and a second open ends, a heat conductive column axially extending in the heat conductive pipe body by a length between the first and second open ends thereof, and multiple heat-radiating vanes radially arranged between and outer periphery of the heat conductive column and an inner periphery of the heat conductive pipe body. Each vane is connected to the outer periphery of the column and the inner periphery of the heat conductive pipe body. Each vane extends by a length corresponding to that of the heat conductive column, whereby each two adjacent vanes, the heat conductive column and the heat conductive pipe body define an independent passage. The heat conductive rod has one end connected with one end of the heat conductive column at the first open end of the heat conductive pipe body, whereby when the the heat conductive rod contacts with a heat source, the heat is quickly conducted to the heat conductive column and then quickly and evenly conducted to the respective vanes and the heat conductive pipe body and then quickly dissipated by natural convection of air.

A heat-radiating fan is secured to the second open end of the heat conductive pipe body. The wind direction of the fan is parallel to the passage for forcedly blowing in or sucking out the hot air in the passages. A rectifying space is preferably defined between the passages and the fan, whereby the fan can more effectively bring out the hot air in the passages.

The present invention can be best understood through the following description and accompanying drawings, wherein:

DETAILED DESCRIPTION OF THE PREFERRED EMBODIMENTS

Figure 3:
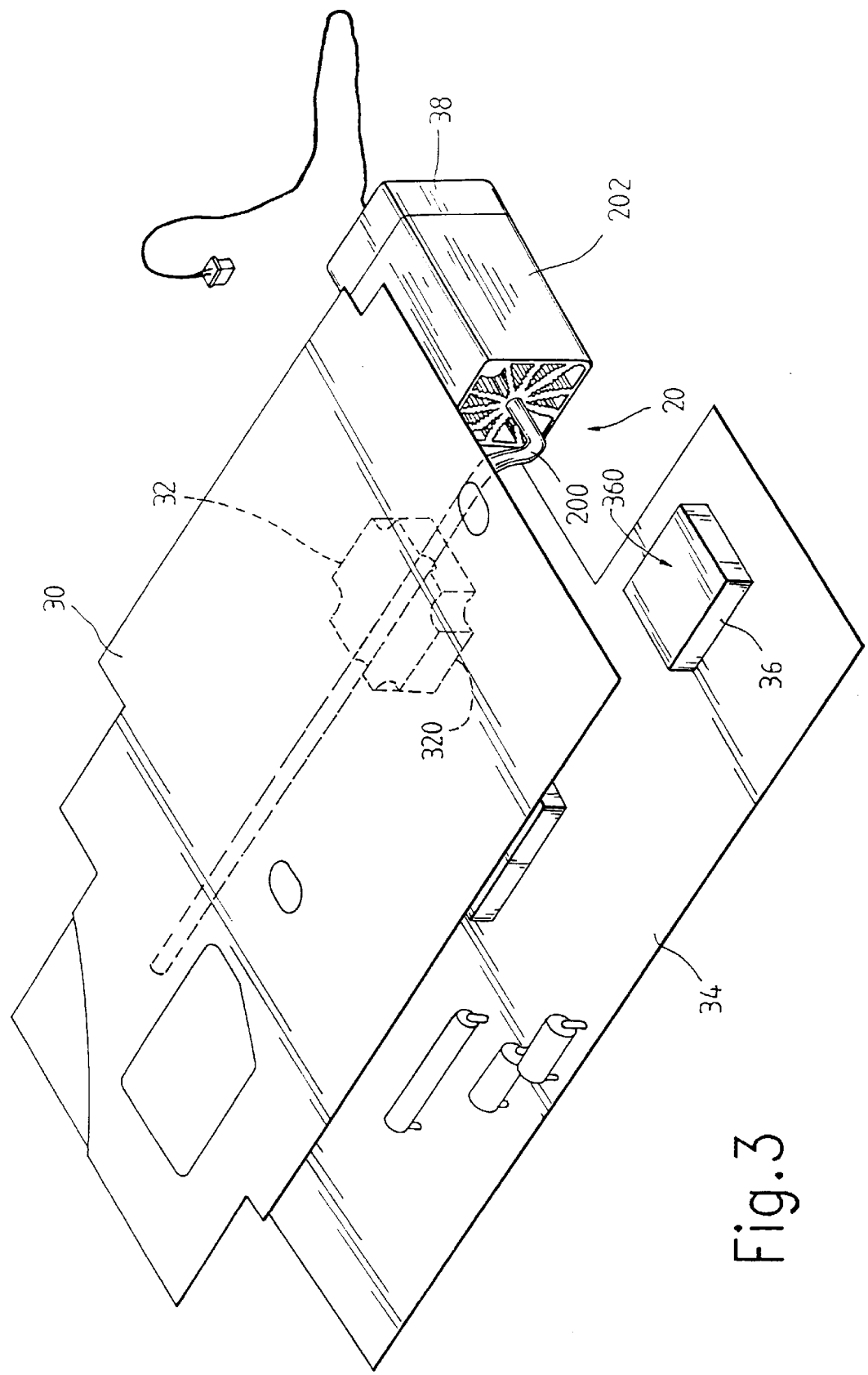
FIG. 3 is a perspective view of a preferred embodiment of the heat-radiating device of the present invention.

Please refer to FIG. 3. The heat-radiating device 20 of the present invention includes a heat conductive rod 200 (heat pipe) which can be an aluminum rod or copper rod. Preferably, the heat conductive rod 200 is a copper rod which has a conductivity 20 to 40 times that of aluminum rod. The heat-radiating device 20 further includes a heat-radiator 202 connected with the heat conductive rod 200. The radiator 202 and the rod section of the heat conductive rod 200 are attached to a lower surface of a heat-radiating aluminum board 30. A heat conductive block 32 is connected with a part of the rod section of the heat conductive rod 200 for heat conduction. The heat conductive block 32 has a plane face 320 attached to a heat dissipating surface 360 of an IC packing 36 mounted on a printed circuit board 34.

The circuit board 34 is spaced from the radiating aluminum board 30 by a certain distance, whereby the heat generated by the electronic elements arranged on the circuit board 34, including the IC packing 36, will be absorbed by the heat conductive block 32, heat conductive rod 200 and the heat dissipating aluminum board 30. The collected heat is then conducted to the radiator 202 via the heat conductive rod 200. With or without a fan 38, the radiator 202 can then radiate the heat.

Figure 4:
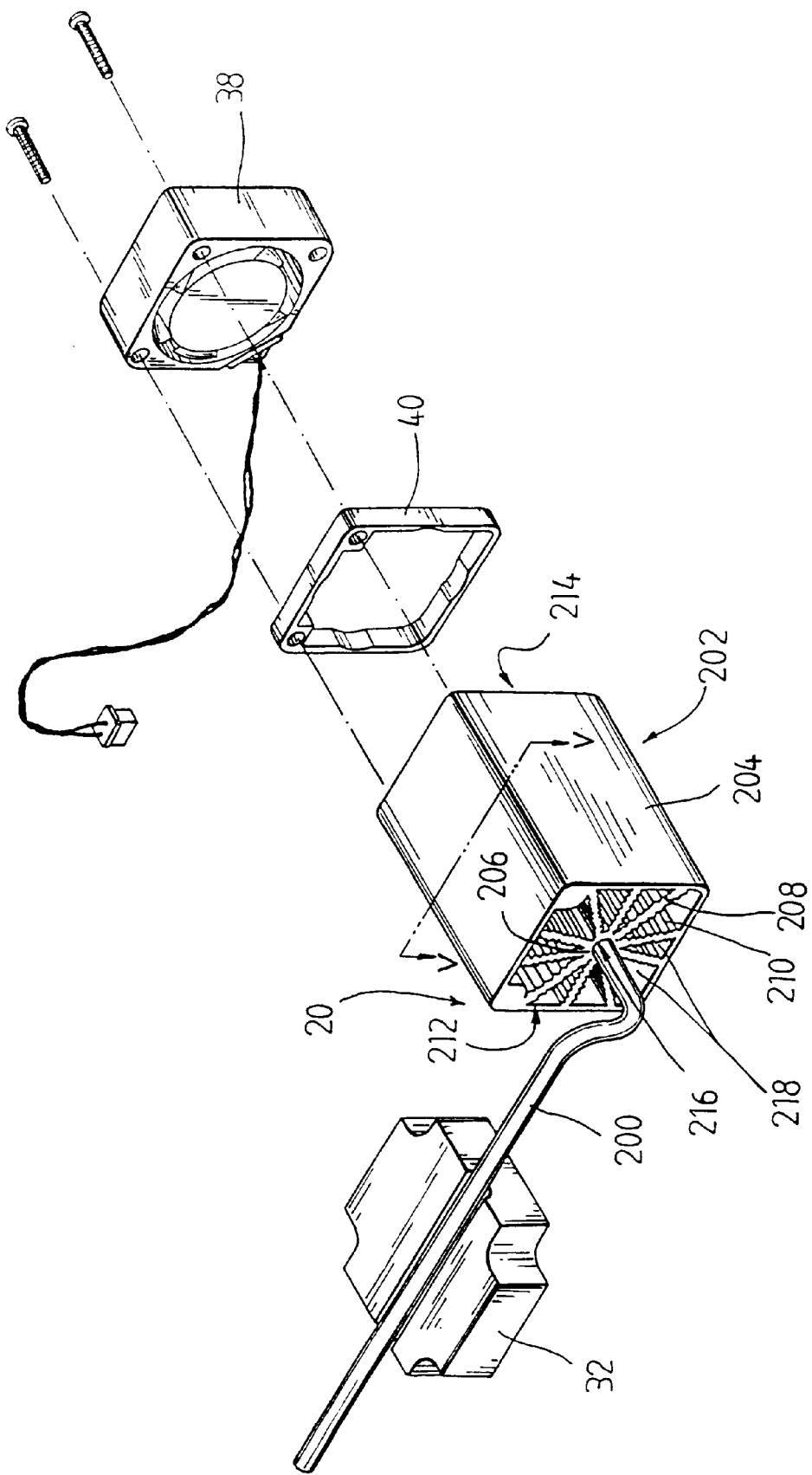
FIG. 4 is a perspective exploded view of a preferred embodiment of the heat-radiating device of the present invention, in which a fan and a heat conductive block are added.

Referring to FIG. 4, the heat radiator 202 is preferably integrally formed by extrusion, including a hollow heat conductive pipe body 204, a heat conductive column 206 and multiple heat-radiating vanes 208 each having saw tooth surface 210. One end face of the pipe body 204 is formed with a first open end 212, while the other end face thereof is formed with a second open end 214. In a preferred embodiment, the pipe body 204 is a rectangular frame.

The heat conductive column 206 axially extends in the heat conductive pipe body 204 between the first and second open ends 212,216. According to this embodiment, the heat conductive column 206 is a hollow member and the end face of the heat conductive column 206 at the first open end 212 is formed with an opening 216, whereby the heat conductive rod 200 can be passed through the opening 216 into the heat conductive column 206. Alternatively, the heat conductive column 206 can be a solid member and one end of the heat conductive rod 200 can be connected with or adhered to the end face of the heat conductive column 206 by welding or heat conductive adhesive.

The heat-radiating vanes 208 are radially arranged between the outer periphery of the heat conductive column 206 and the inner periphery of the heat conductive pipe body 204. Each vane 208 is connected to the outer periphery of the column 206 and the inner periphery of the heat conductive pipe body 206. Also, each vane 208 extends by a length corresponding to that of the heat conductive column, whereby each two adjacent vanes 208, the heat conductive column 206 and the heat conductive pipe body 204 define an independent passage 218.

Figure 1:
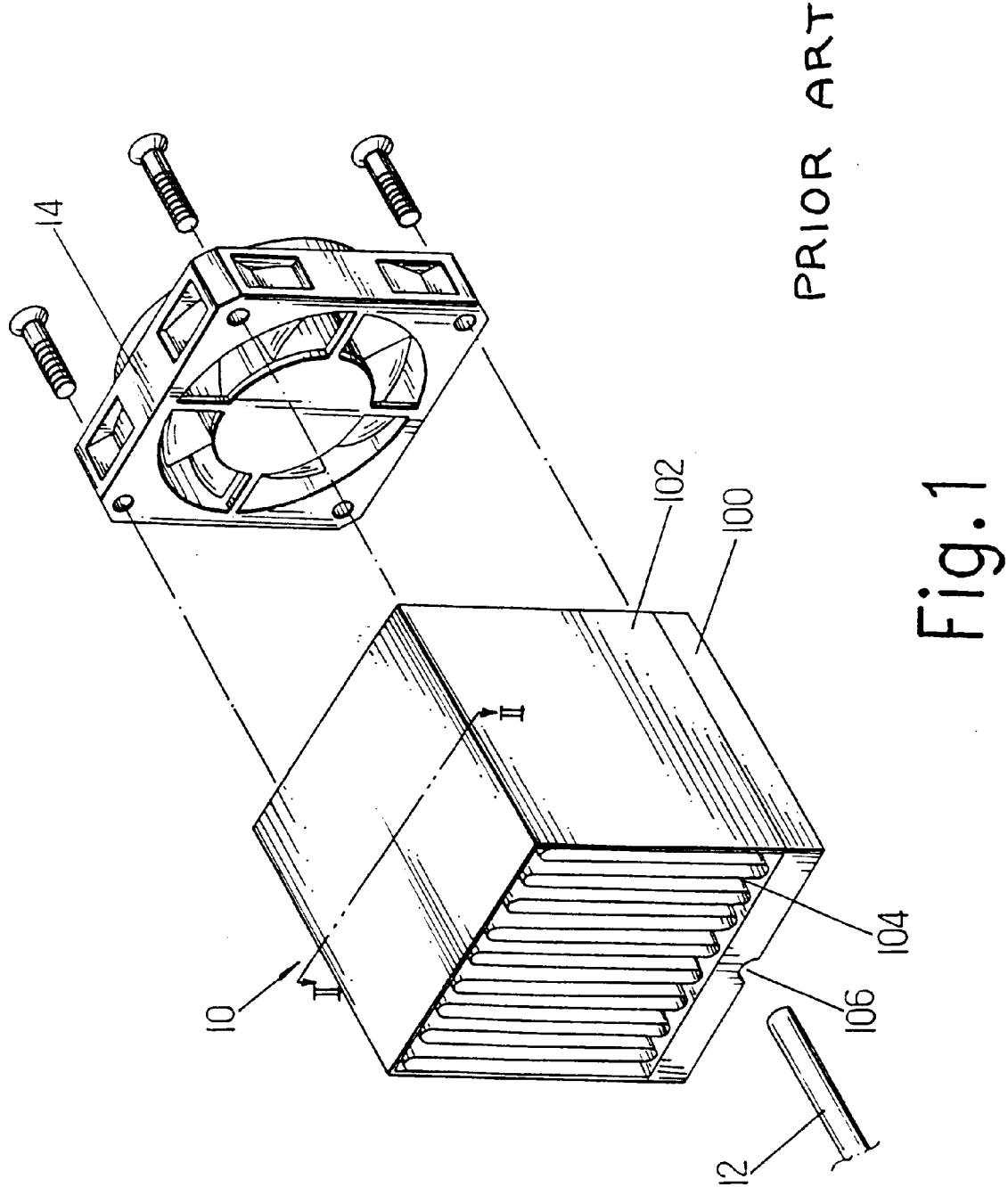
FIG. 1 is a perspective exploded view of a conventional heat-radiating device.
Figure 2:
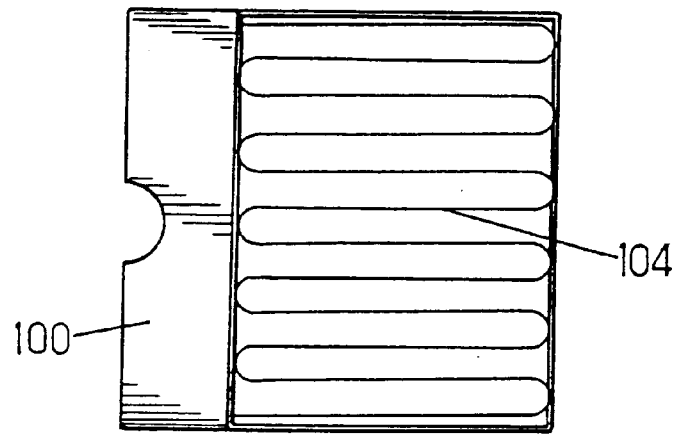
FIG. 2 is a sectional view taken along line II—II of FIG. 2A shows the property curve diagram of the respective points X along the length of each fin versus the temperature T when the base seat of FIG. 2 absorbs heat.
Figure 2A:
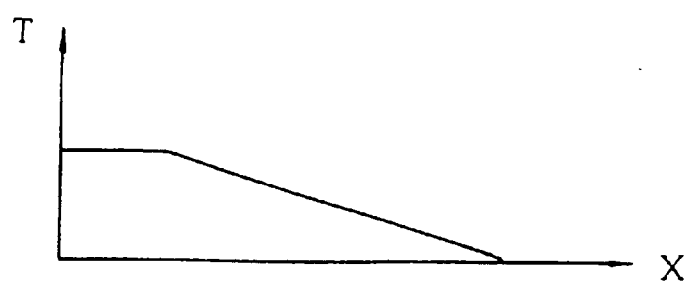

In addition, as shown in FIG. 1, a fan 38 can be directly disposed on the radiator 202 at the end distal from the heat conductive rod 200. As shown in FIG. 4, preferably, a close wind guide pipe 40 is disposed between the fan 38 and the second open end 214 of the heat conductive pipe body. The cross-sectional area of the wind guide pipe 40 is equal to that of the second open end 214. The wind direction of the fan 38 is parallel to the passage 218. However, in addition to the parallel wind force, an oblique wind force exists in the passage 218. Therefore, by means of the wind guide pipe 40, the parallel and oblique wind forces in the passage 218 can be both rectified and then brought out by the fan 38. Alternatively, the wind guide pipe 40 can be omitted. Instead, the heat conductive column 206 can extend by a length less than or near the second open end 214 of the heat conductive pipe. Therefore, a space serving as the wind guide pipe 40 is defined by the extending end face of the heat conductive column 206, the end face of the second open end 214 of the heat conductive pipe body, the outer periphery of the heat conductive column 206 and the inner periphery of the heat conductive pipe body 204.

Figure 5:
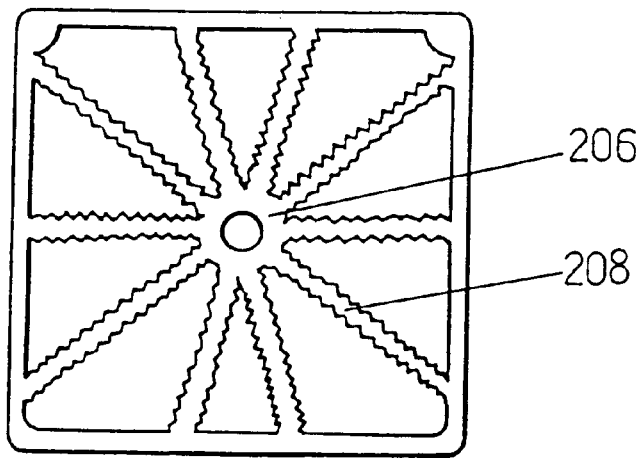
FIG. 5 is a sectional view taken along line V—V of FIG. 5A shows the property curve diagram of the respective points X along the length of each fin versus the temperature T when the heat conductive column of FIG. 5 absorbs heat.
Figure 5A:
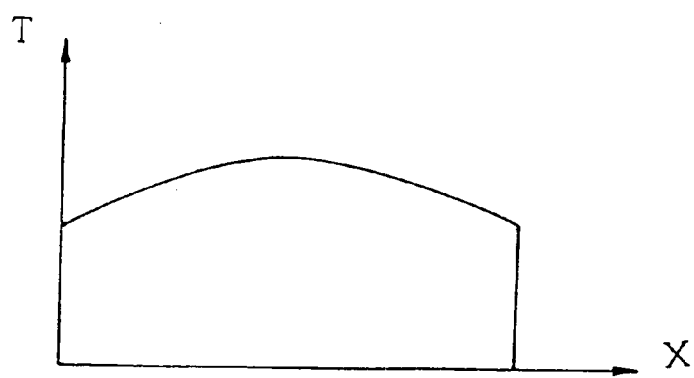

Referring to FIGS. 5 and 5A when the heat conductive column 206 absorbs the heat conducted by the heat conductive rod 200 from the heat source, the heat is spread from the center of the heat conductive column 206. The distance is shortest so that the heat can be quickly and evenly conducted to the respective vanes 208 and the heat conductive pipe body 204 and then quickly dissipated by natural convection of air.

Figure 6:
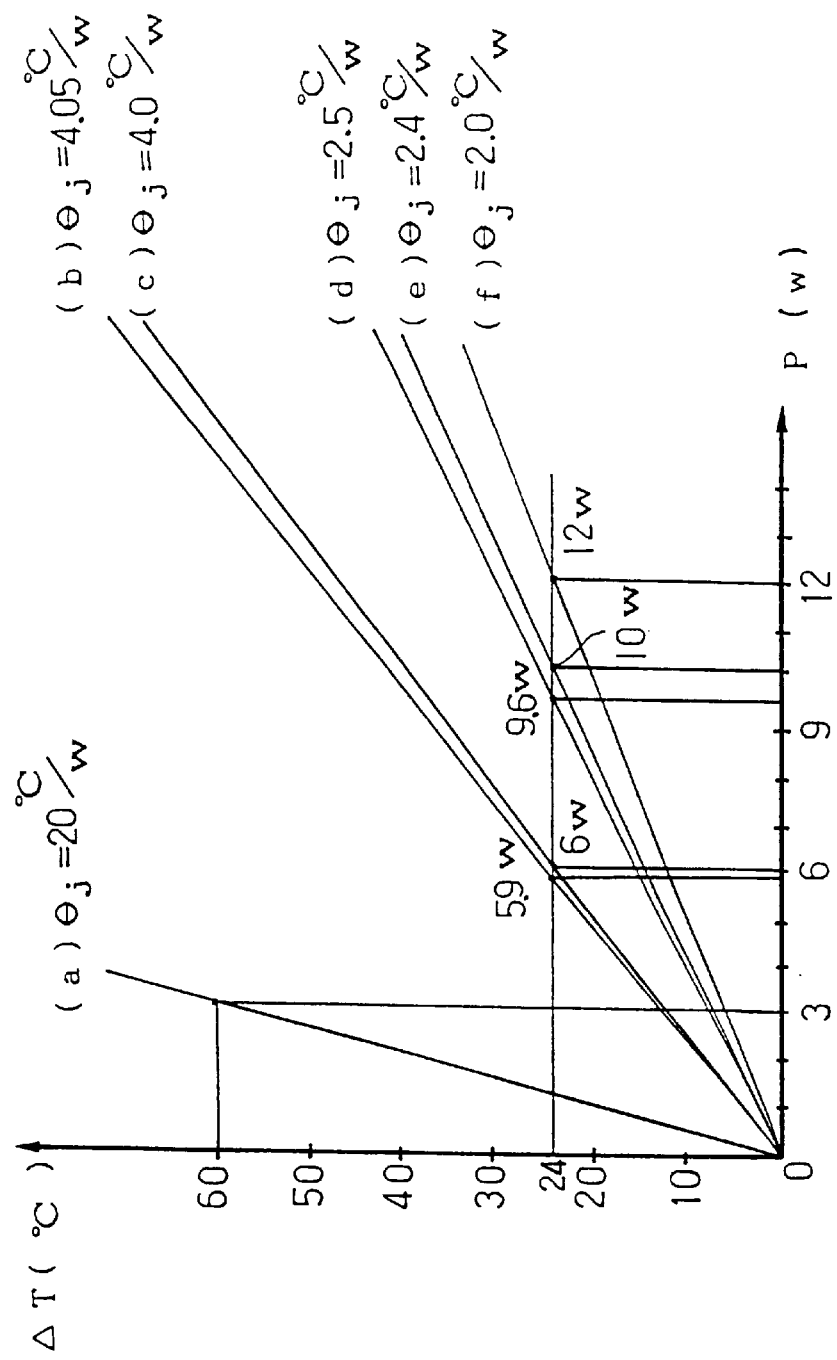
FIG. 6 is a property comparison diagram between different heat-radiating devices with respect to walt P exerted by heat source onto the IC versus the room temperature difference ΔT of heat dissipating surface of the packing.

FIG. 6 is a comparison diagram between different heat-radiating devices with respect to what P exerted by heat source onto the IC versus the room temperature difference ΔT of heat dissipating surface of the packing (equal to heat source temperature Tc minus room temperature Ta), wherein (a) represents no heat-radiating device is added, (b) represents the conventional heat-radiating device 10 is added without the fan 14, (c) represents the present heat-radiating device 20 is added without the fan 38, (d) represents the conventional heat-radiating device 10 and the fan 14 are added, (e) represents the present heat-radiating device 20 and the fan 38 are added without the wind guide pipe 40 and (f) represents the present heat-radiating device 20, the fan 38 and the wind guide pipe 40 are added. Under the same size of the present invention and the conventional heat-radiating device, the thermal impedance Qj(=ΔT/P) of (a) to (f) of FIG. 6 respectively are (a) Qj=20° C./w, (b) Qj=4.05° C./w, (c) Qj=4.0° C./w, (d) Qj=2.5° C./w, (e) Qj=2.4° C./w, (f) Qj=2.0° C./w. Therefore, with respect to the subject temperature difference ΔT at 24° C.:

1. Under the natural convection state (without the fan), the present invention can radiate 6 w heat which is better than the 5.9 w of the conventional device.
2. Under the forced convection state (with the fan added), without the wind guide pipe, the present invention can radiate about 10 w heat. With the wind guide pipe, the present invention can radiate about 12 w heat. This is better than the 9.6 w of the conventional device.

It should be noted that the above description and accompanying drawings are only used to illustrate some embodiments of the present invention, not intended to limit the scope thereof. Any modification of the embodiments should fall within the scope of the present invention.

What is claimed is:

1. A heat-radiating device comprising:
   a heat-radiator including:
   a hollow heat conductive pipe body having a first and a second open ends;
   a heat conductive column axially extending in the heat conductive pipe body by a length between the first and second open ends thereof; and
   multiple heat-radiating vanes radially arranged between an outer periphery of the heat conductive column and an inner periphery of the heat conductive pipe body, each vane being connected to the outer periphery of the column and the inner periphery of the heat conductive pipe body, each vane extending by a length corresponding to that of the heat conductive column, whereby each two adjacent vanes, the heat conductive column and the heat conductive pipe body define an independent passage; and
   a heat conductive rod having one end connected with one end of the heat conductive column at the first open end of the heat conductive pipe body, whereby when the heat conductive rod contacts with a heat source, the heat is quickly conducted to the heat conductive column and then quickly and evenly conducted to the respective vanes and the heat conductive pipe body and then quickly dissipated by natural convection of air.

2. A heat-radiating device as claimed in claim 1, wherein the heat-radiating vane has a saw tooth surface.

3. A heat-radiating device as claimed in claim 1 or 2, wherein the heat-radiator is integrally formed by extrusion.

4. A heat-radiating device as claimed in claim 1, wherein the heat conductive column extends by a length to the second open end of the heat conductive pipe body.

5. A heat-radiating device as claimed in claim 1, wherein the heat conductive column extends by a length near the second open end of the heat conductive pipe body so as to form a space defined by an extending end face of the heat conductive column, an end face of the second open end of the heat conductive pipe body, the outer periphery of the heat conductive column and the inner periphery of the heat conductive pipe body.

6. A heat-radiating device as claimed in claim 4, further comprising a heat-radiating fan secured to the second open end of the heat conductive pipe body, the wind direction of the fan being parallel to the passage.

7. A heat-radiating device as claimed in claim 5, further comprising a heat-radiating fan secured to the second open end of the heat conductive pipe body, the wind direction of the fan being parallel to the passage.

8. A heat-radiating device as claimed in claim 6, wherein a close wind guide pipe is disposed between the fan and the second open end of the heat conductive pipe body, the cross-sectional area of the wind guide pipe being equal to that of the second open end.

9. A heat-radiating device as claimed in claim 1, wherein the heat conductive column is a hollow member and the end face of the heat conductive column at the first open end is formed with an opening, whereby the heat conductive rod can be passed through the opening into the heat conductive column.

10. A heat-radiating device as claimed in claim 1 or 9, further comprising a conductive block connected with a rod section of the heat conductive rod for heat conduction, the heat conductive block having a plane face attached to a heat dissipating surface of an IC packing.

11. A heat-radiating device as claimed in claim 1 or 9, further comprising a heat-radiating aluminum board connected with the rod section of the heat conductive rod for heat convection.

12. A heat-radiating device as claimed in claim 11, wherein the heat-radiating aluminum board is parallelly disposed above a printed circuit board for collecting the heat generated by the electronic elements mounted on the circuit board.

13. A heat-radiating device as claimed in claim 1, wherein the heat conductive pipe body is a rectangular frame.

14. A heat-radiating device as claimed in claim 1, wherein the heat conductive rod is an aluminum pipe.

15. A heat-radiating device as claimed in claim 1, wherein the heat conductive rod is a copper pipe.

* * * * *